(12) United States Patent
Ozaki et al.

(10) Patent No.: US 7,808,085 B2
(45) Date of Patent: Oct. 5, 2010

(54) SEMICONDUCTOR DEVICE AND MOLD FOR RESIN-MOLDING SEMICONDUCTOR DEVICE

(75) Inventors: Hiroyuki Ozaki, Tokyo (JP); Hisashi Kawafuji, Tokyo (JP); Shinya Nakagawa, Fukuoka (JP); Kenichi Hayashi, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 146 days.

(21) Appl. No.: 11/599,258

(22) Filed: Nov. 15, 2006

(65) Prior Publication Data

US 2007/0132112 A1    Jun. 14, 2007

(30) Foreign Application Priority Data

Dec. 12, 2005    (JP)    ............................ 2005-357171

(51) Int. Cl.
  *H01L 23/28*    (2006.01)
(52) U.S. Cl. ................... 257/667; 257/787; 257/678; 257/100; 257/433; 438/15; 438/25; 438/26; 438/51; 438/55; 438/64; 438/65; 438/66; 438/67; 438/127; 438/124; 438/126
(58) Field of Classification Search ............... 257/788
  See application file for complete search history.

(56) References Cited

U.S. PATENT DOCUMENTS 5,834,842 A * 11/1998 Majumdar et al. .......... 257/718

6,734,571 B2 * 5/2004 Bolken ....................... 257/787
2005/0067719 A1  3/2005 Hayashi et al.
2005/0082690 A1  4/2005 Hayashi et al.

FOREIGN PATENT DOCUMENTS

| JP | 8-204064 A | 8/1996 |
|---|---|---|
| JP | 2002-329815 A | 11/2002 |
| JP | 2004-146706 | 5/2004 |
| JP | 2005-150595 A | 6/2005 |
| KR | 10-2005-0031877 | 4/2005 |

* cited by examiner

*Primary Examiner*—Marcos D. Pizarro
*Assistant Examiner*—Eva Yan Montalvo
(74) *Attorney, Agent, or Firm*—Buchanan Ingersoll & Rooney PC

(57) ABSTRACT

A semiconductor device includes a pair of power chips, an IC chip, a plurality of leads one of which having a die pad on which the power chips are mounted and another one having a die attach portion on which the IC chip is mounted, a resin sheet firmly adhered to one side of the die pad, and a resin casing made by molding operation to encapsulate the power chips, the IC chip and the resin sheet by a resin in such a manner that one surface of the resin sheet opposite the die pad is exposed to the exterior of the resin casing. The resin casing has a groove formed in one surface opposite the exposed surface of the resin sheet, the groove extending parallel to the resin sheet and perpendicular to a runner through which the resin was supplied in the molding operation.

7 Claims, 7 Drawing Sheets

SEMICONDUCTOR DEVICE AND MOLD FOR RESIN-MOLDING SEMICONDUCTOR DEVICE

BACKGROUND OF THE INVENTION

1. Field of the Invention

The present invention relates to a semiconductor device including a group of leads, an integrated circuit (IC) chip mounted on one of the leads, a power chip (semiconductor chip) mounted on a die pad, a resin sheet disposed on a bottom side of the die pad to provide insulation, and a resin casing made of a molded resin compound encapsulating all internal elements of the semiconductor device. The invention pertains also to a resin molding die (or mold) used for resin-molding internal elements of such a semiconductor device.

2. Description of the Background Art

A semiconductor device to which the invention is directed is manufactured by a process including bonding semiconductor dies, or chips, such as a power chip and an IC chip, to a leadframe, wire-bonding the power chip and the IC chip to the leadframe, resin-molding all these internal elements of the semiconductor device into a single package.

Wire bonding establishes electrical connections between the power chip and the leadframe by using aluminum wires and between the IC chip and the leadframe by using gold wires. Since the semiconductor device incorporates the power chip which handles a large electric current and generates heat, the semiconductor package must provide high heat dissipation and insulation capabilities.

Conventionally, this kind of semiconductor device is structured as described in Japanese Patent Application Publication No. 2005-123495, for example. Specifically, the semiconductor device disclosed in this Publication is provided with a resin sheet having first and second surfaces disposed on a bottom side of a die pad, the resin sheet forming an insulating layer having at least a specific thickness to provide high insulation quality. Internal elements of the semiconductor device are resin-molded into a single package. The resin sheet is made of resin material whose thermal conductivity is higher than that of a resin molding compound used for encapsulation.

The semiconductor device can provide high heat dissipation and insulation capabilities only if the resin sheet disposed on the back side of the die pad is held in tight adhesion thereto. To make this certain, a resin-molding process of the aforementioned Publication employs a transfer molding technique using a resin molding die (or mold) provided with squeeze pins for forcing the die pad against the resin sheet to hold the die pad in tight contact with the resin sheet during the molding process.

For the semiconductor device designed to handle a large electric current, the molding process performed by using the mold provided with the squeeze pins for forcing the die pad against the resin sheet has a problem that the provision of the squeeze pins results in an increase in size of a molding machine due to the need for pressing the squeeze pins against the die pad.

Additionally, the aforementioned squeeze pin approach of the prior art results in an increased die pad thickness and stiffness. This requires a large-sized apparatus for firmly adhering the die pad to the resin sheet by the squeeze pins.

SUMMARY OF THE INVENTION

In light of the foregoing, it is an object of the invention to provide a semiconductor device including a group of leads having at least one die pad, a power chip for handling a large electric current and a resin sheet disposed on a back side of the die pad, the semiconductor device providing a capability to efficiently dissipate heat generated by the power chip to the exterior of the semiconductor device. It is another object of the invention to provide a resin molding die (or mold) used for resin-molding internal elements of such a semiconductor device.

According to one aspect of the invention, a semiconductor device includes a semiconductor chip, a die pad on which the semiconductor chip is mounted, a dielectric resin sheet placed on one side of the die pad opposite the semiconductor chip, the resin sheet being firmly adhered to the die pad, and a resin casing made by molding operation in which the semiconductor chip, the die pad and the resin sheet are molded by a resin in such a manner that one surface of the resin sheet opposite the die pad is exposed to the exterior of the resin casing. The resin casing has a groove formed in one surface opposite the exposed surface of the resin sheet, the groove extending parallel to the resin sheet and perpendicular to a runner through which the resin was supplied in the molding operation.

According to another aspect of the invention, a mold for manufacturing a semiconductor device includes an upper mold section and a lower mold section together forming a cavity inside. The mold is used for performing molding operation in which a dielectric resin sheet is placed on an inside bottom surface of the lower mold section, a die pad is placed on an upper surface of the resin sheet with a semiconductor chip mounted on the die pad, and a resin is supplied into the cavity through a runner formed in the mold from one side thereof to mold internal elements of the semiconductor device including the resin sheet, the die pad and the semiconductor chip. The upper mold section has a ridge projecting into the cavity from an upper inside surface of the upper mold section, the ridge extending in a direction perpendicular to the runner.

According to the invention, the semiconductor device and the mold for manufacturing the semiconductor device are structured such that the resin supplied into the cavity of the mold forces an entire area of the die pad against the underlying resin sheet in a molding process. This structure serves to provide excellent adhesion between the die pad and the resin sheet as well as high insulation for the die pad, allowing for an eventual cost reduction of the semiconductor device.

These and other objects, features and advantages of the invention will become more apparent upon a reading of the following detailed description in conjunction with the accompanying drawings.

DESCRIPTION OF THE PREFERRED EMBODIMENTS

First Embodiment

Figure 1:
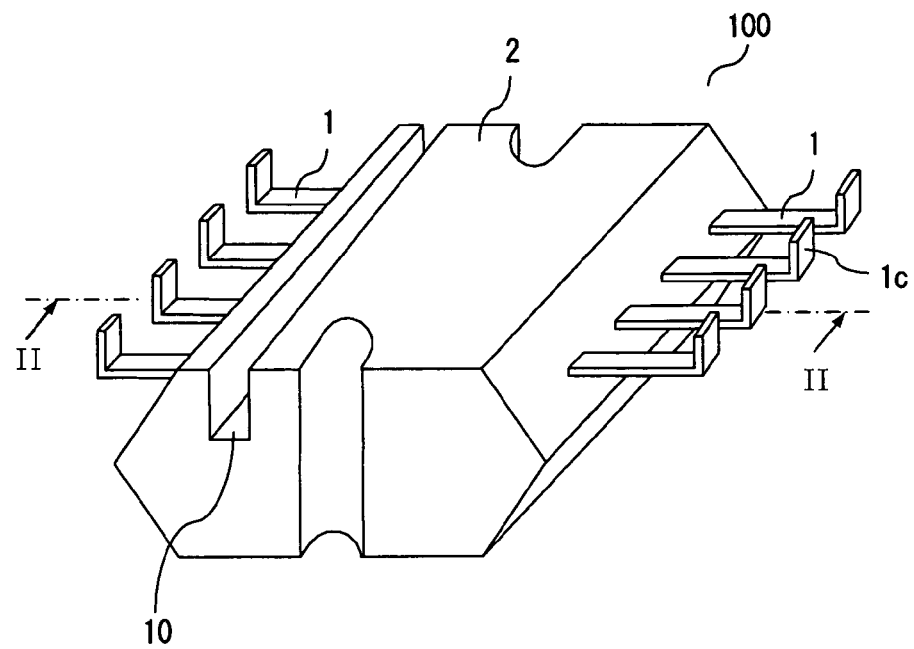
FIG. 1 is a perspective view of a semiconductor device according to a first embodiment of the invention.
Figure 2:
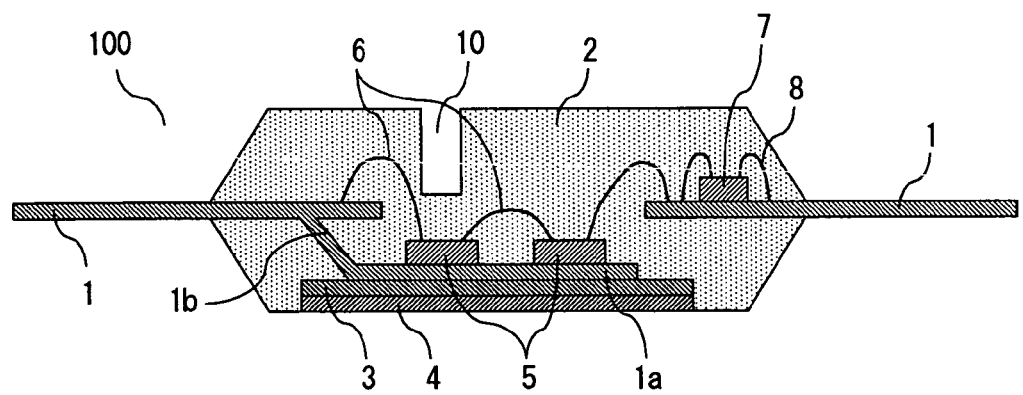
FIG. 2 is a cross-sectional view taken along lines II-II of FIG. 1.
Figure 3:
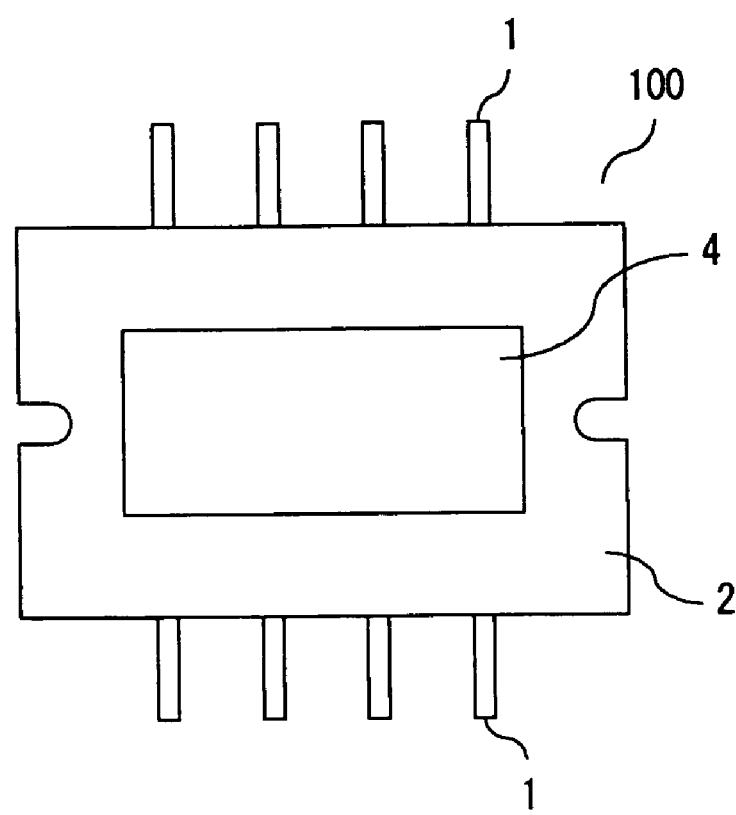
FIG. 3 is a bottom view of the semiconductor device of FIG. 1.
Figure 4A:
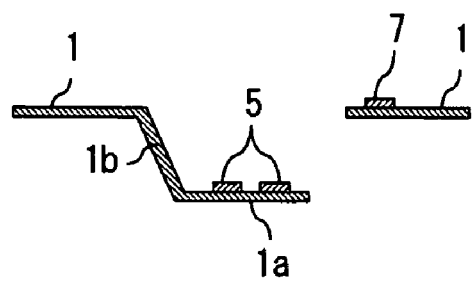
FIGS. 4A-4G are cross-sectional side views showing steps for manufacturing the semiconductor device of FIG. 1 by using a resin molding die (or mold) of the first embodiment.
Figure 4B:
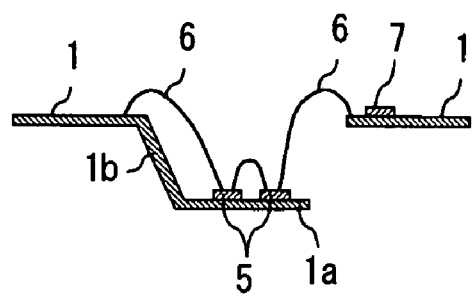
Figure 4C:
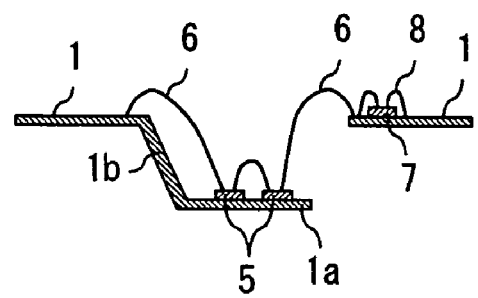
Figure 4D:
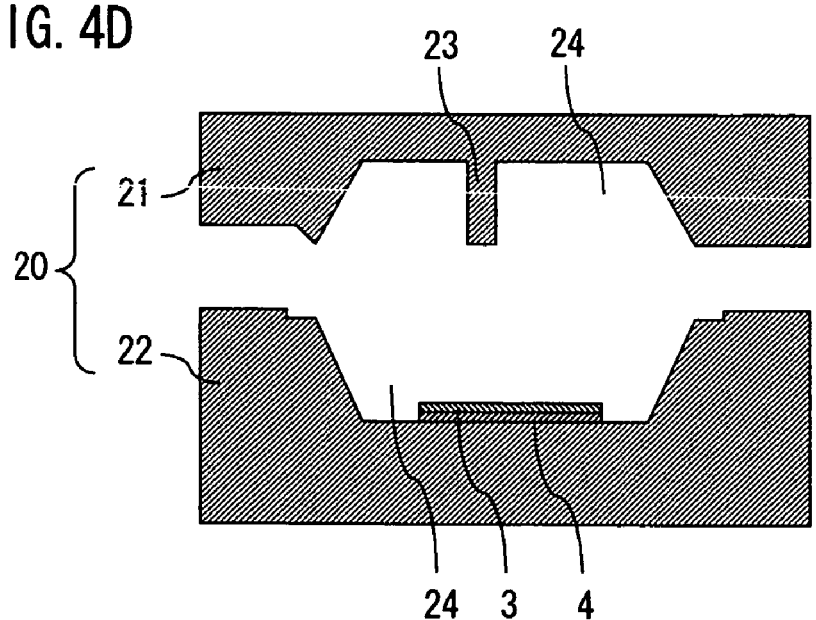
Figure 4E:
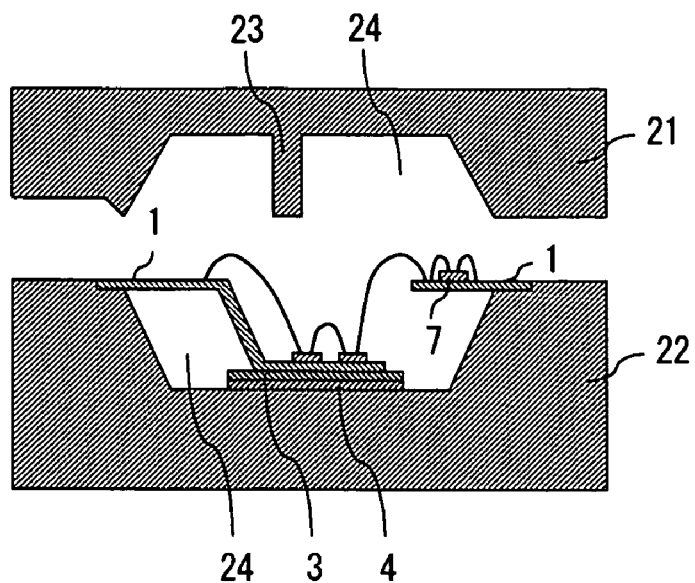
Figure 4F:
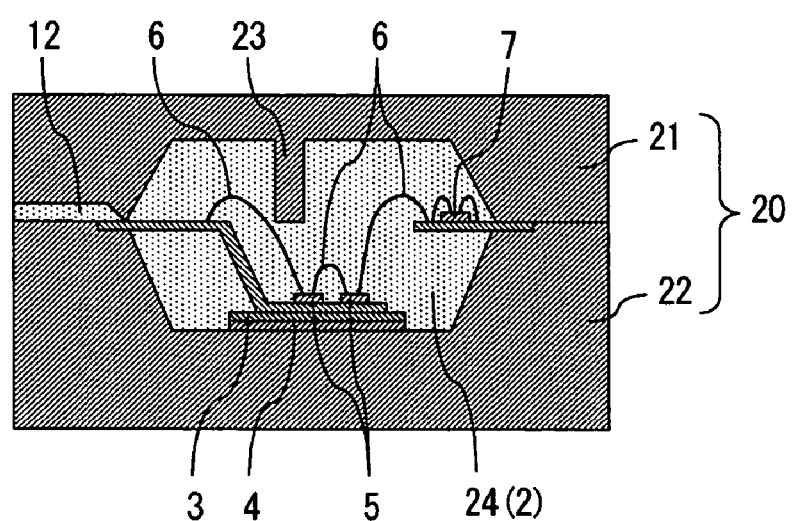
Figure 4G:
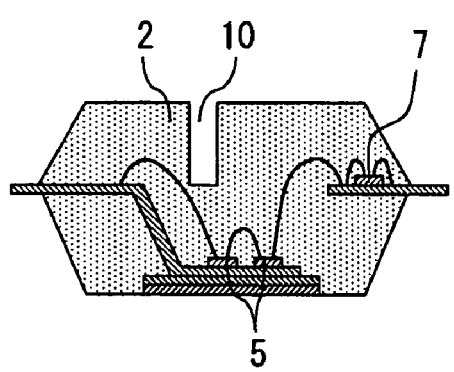
Figure 5A:
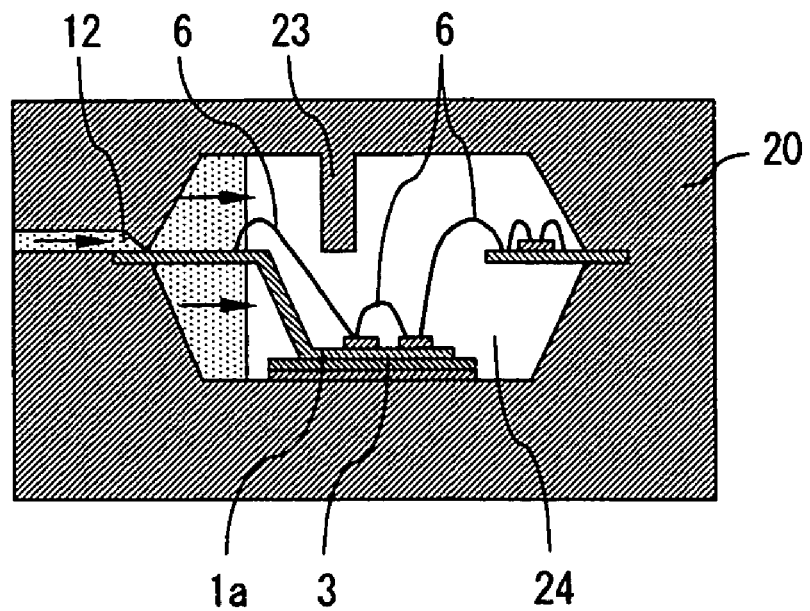
FIGS. 5A and 5B are cross-sectional side views showing steps for manufacturing the semiconductor device of FIG. 1 by using the mold of the first embodiment.
Figure 5B:
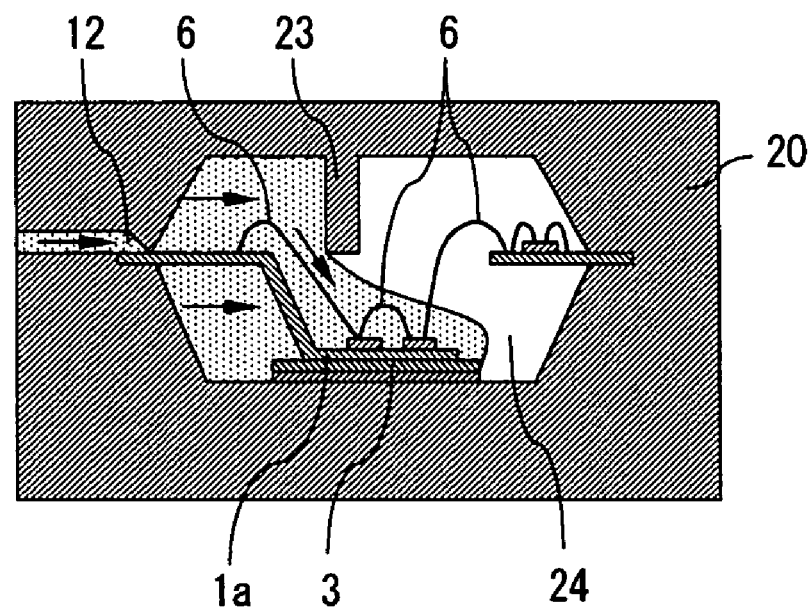
Figure 6:
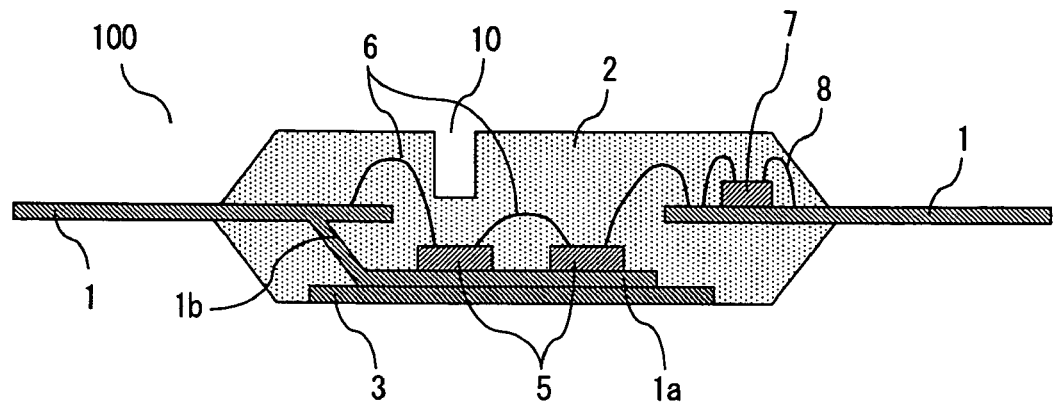
FIG. 6 is a cross-sectional side view of a semiconductor device according to one varied form of the first embodiment.

FIG. 1 is a perspective view of a semiconductor device 100 according to a first embodiment of the invention, FIG. 2 is a cross-sectional side view taken along lines II-II of FIG. 1, FIG. 3 is a bottom view of the semiconductor device 100 of FIG. 1, FIGS. 4A-4G, 5A and 5B are cross-sectional side views showing a process of manufacturing the semiconductor device 100 by using a resin molding die (or mold) 20 of the first embodiment, and FIG. 6 is a cross-sectional side view of a semiconductor device 100 according to one varied form of the first embodiment.

Referring to FIG. 1, the semiconductor device 100 has a resin-molded package structure in which a plurality of shaped metallic leads 1 stick out from both sides of a molded resin casing 2 which is preferably made of an epoxy resin.

Referring to FIG. 2, the semiconductor device 100 includes, in addition to the aforementioned shaped leads 1, an IC chip 7, such as a logic chip, and a pair of power chips 5, such as insulated-gate bipolar transistors (IGBTs) or freewheeling (FW) diodes. One of the leads 1 has a die pad 1a on which the power chips 5 are mounted and a downward bent portion 1b connecting the die pad 1a to an external lead portion.

The power chips 5 and the IC chip 7 are connected to one another and to the leads 1 by bonding wires 6, 8 which are made either of gold or aluminum, for example. The IC chip 7 serves as a control IC for controlling the working of the power chips 5. While the semiconductor device 100 of this embodiment includes two power chips 5 and one IC chip 7 as illustrated in FIG. 2, the semiconductor device 100 may include any numbers of power chips 5 and IC chips 7 depending on functions to be performed.

The molded resin casing 2 contains a resin sheet 3 with a metal foil 4 attached to a bottom side of the resin sheet 3. Extremities 1c of the leads 1 arranged on both sides of the molded resin casing 2 are aligned parallel to an extending direction of a groove 10 formed in the molded resin casing 2 as shown in FIG. 1. The metal foil 4 made of copper, for example, is exposed on a bottom surface of the molded resin casing 2 as illustrated in FIG. 3. The extending direction of the groove 10 is perpendicular to an extending direction of a later-described runner 12 formed in the mold 20 for feeding a fluid molding compound (resin) in a transfer molding process.

The resin sheet 3 is preferably made of an epoxy resin containing a filler which is one material selected from the group consisting of silicon dioxide ($SiO_2$), aluminum oxide ($Al_2O_3$), aluminum nitride (AlN), silicon nitride ($Si_3N_4$), boron nitride (BN) and any combination thereof. The resin sheet 3 has a higher thermal conductivity than the molded resin casing 2. It is to be understood that the resin sheet 3 need not necessarily be backed with the metal foil 4 but may be embedded alone in the bottom of the molded resin casing 2 as shown in FIG. 6.

The leads 1 are fixedly embedded in the molded resin casing 2 in such a way that a bottom side of the die pad 1a is in direct contact with an upper surface of the resin sheet 3. In the semiconductor device 100 of this embodiment, the bottom side of the die pad 1a is held in direct contact with the upper surface of the resin sheet 3 in this fashion with no part of the molded resin casing 2 sandwiched in between. This structure ensures easy conduction of heat from the die pad 1a to the resin sheet 3, thus providing an increased capability of the semiconductor device 100 to dissipate heat from the power chips 5 mounted on the die pad 1a.

Referring now to FIGS. 4A-4G, the manufacturing process of the semiconductor device 100 using the aforementioned mold 20 is discussed in a step-by-step fashion below.

Step 1: Leadframe Preparation and Die Attach

A leadframe made of a copper sheet, for example, patterned to form the aforementioned multiple leads 1 is prepared as shown in FIG. 4A. The IC chip 7 is attached to a die attach portion formed in one of the leads 1 and the power chips 5 are attached to the die pad 1a formed in the leadframe by use of solder, silver paste or the like.

Step 2: Aluminum Wire Bonding

Internal and external connections for the power chips 5 are established by connecting aluminum bonding wires 6 between the two power chips 5, between each power chip 5 and the leadframe, and between one lead 1 and another of the leadframe according to a prescribed wiring schedule as shown in FIG. 4B. The bonding wires 6 are not necessarily limited to aluminum wires but may be made of an alloy containing aluminum as a main constituent or other metallic materials.

Step 3: Gold Wire Bonding

The IC chip 7 is connected to specific bonding sites of the leadframe using gold bonding wires 8 as shown in FIG. 4C. As an alternative, the bonding wires 8 may be made of an alloy containing gold as a main constituent or other metallic materials.

While the IC chip 7 is connected to the power chips 5 via one or more leads 1 as illustrated in FIG. 4C, the IC chip 7 may be directly connected to one or both of the power chips 5. Also, the IC chip 7 may be connected to the leadframe by using metal strips instead of the bonding wires 8.

Step 4: Mold Preparation

The mold 20 used for resin molding is prepared as shown in FIG. 4D. The mold 20 is divided into an upper mold section 21 and a lower mold section 22 together forming a cavity 24 inside. The mold 20 has the aforementioned runner 12 formed between the upper and lower mold sections 21, 22 for feeding the molding compound in fluid form into the cavity 24 from a side of the mold 20 (refer to FIG. 4F). There is formed an elongate ridge 23 on a ceiling (upper inside surface) of the upper mold section 21 for forming the groove 10 shown in FIGS. 1 and 2, the ridge 23 extending in a direction perpendicular to the runner 12 (i.e., perpendicular to this page).

Step 5: Leadframe Placement

The resin sheet 3 backed with the metal foil 4 is prepared and placed in position inside the mold 20. The resin sheet 3 is placed such that a bottom side the metal foil 4 lies in contact with an inside bottom surface of the lower mold section 22.

Then, the leadframe carrying the power chips 5, the IC chip 7, the bonding wires 6, 8 and so on is placed in position inside the mold 20 in such a manner that the bottom side of the die pad 1a lies in contact with the upper surface of the resin sheet 3 as illustrated in FIG. 4E.

While the resin sheet 3 backed with the metal foil 4 is first placed in the lower mold section 22 and then the leadframe carrying the chips 5, 7 and the bonding wires 6, 8 is placed on the resin sheet 3 in step 5 of the present embodiment, this step may be so modified as to temporarily attach the leadframe carrying the chips 5, 7 and the bonding wires 6, 8 to the upper surface of the resin sheet 3 and then place the leadframe with the resin sheet 3 on the lower mold section 22.

Step 6: Molding (Encapsulation)

Now, the upper mold section 21 is placed on top of the lower mold section 22 and the two mold sections 21, 22 are assembled together. When fixing the upper and lower mold sections 21, 22 to each other, care must be exercised not to damage the power chips 5, the IC chip 7 or the bonding wires 6, 8 especially by the ridge 23 of the upper mold section 21.

Subsequently, the molding compound (e.g., epoxy resin) in preheated fluid form is forced into the cavity 24 of the mold 20 under pressure through the runner 12 formed therein by transfer molding.

The molding compound introduced through the runner 12 initially flows in a generally horizontal arrow direction shown in FIG. 5A, progressively filling up the cavity 24 from areas nearer the runner 12. As the fluid molding compound travels further and reaches the ridge 23, the molding compound turns its path in a direction indicated by an oblique arrow shown below the ridge 23 in FIG. 5B. The molding compound flows obliquely downward beneath the vertical ridge 23 in this way. This flow of the molding compound applies downward pressure selectively to the die pad 1a which forces the resin sheet 3 downward against the lower mold section 22. This structure of the mold 20 serves to secure good adhesion between the die pad 1a and the resin sheet 3.

If the upper mold section 21 is not provided with the ridge 23, the molding compound introduced through the runner 12 would flow only horizontally all the way through the cavity 24, so that the aforementioned oblique flow of the compound selectively forcing the die pad 1a downward against the resin sheet 3 would not be obtained. In this case, adhesion between the die pad 1a and the resin sheet 3 may potentially become insufficient.

According to the above-described mold structure of the present embodiment, the die pad 1a is selectively forced downward against the resin sheet 3 in a reliable fashion. Therefore, even if a small gap is initially formed between the die pad 1a and the resin sheet 3 due to dimensional tolerances when the leadframe carrying the chips 5, 7 and the bonding wires 6, 8 is placed on top of the resin sheet 3 backed with the metal foil 4 in the cavity 24 of the mold 20, the structure of the embodiment would provide excellent adhesion between the die pad 1a and the resin sheet 3 as a result of the molding operation.

Step 7: Frame Cutting and Lead Trimming/Forming

After the molding step discussed above, the semiconductor package with the untrimmed leadframe is removed from the mold 20 as shown in FIG. 4G and subjected to a postcuring process to allow the molding compound to completely harden. Finally, excess parts of the leadframe, such as side rails and tie bars, are cut away and the individual leads 1 are bent at far ends to form the shaped lead extremities 1c, whereby the finished semiconductor device 100 shown in FIG. 1 is obtained.

As already mentioned, the semiconductor device 100 may be provided with any numbers of power chips 5 and IC chips 7. Additionally, materials used for producing the aluminum bonding wires 6 and the gold bonding wires 8 are not specifically limited. For example, these bonding wires 6, 8 may be made of an alloy containing aluminum or gold as a main constituent or metallic materials other than aluminum and gold, such as copper.

Second Embodiment

Figure 7:
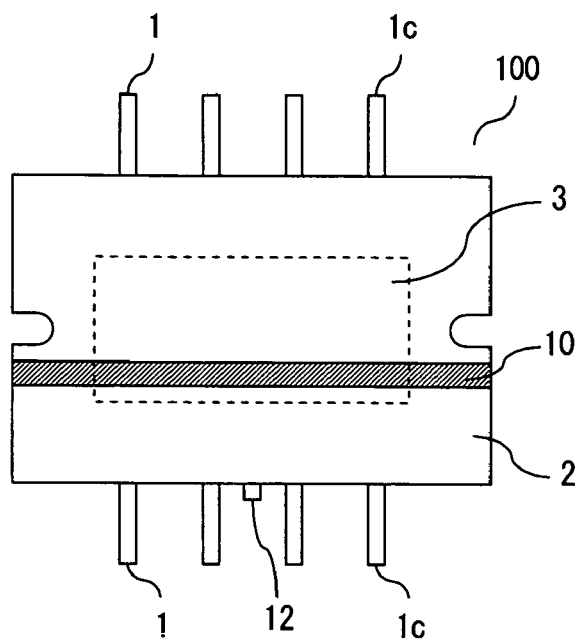
FIG. 7 is a plan view of a semiconductor device according to a second embodiment of the invention.

FIG. 7 is a plan view of a semiconductor device 100 according to a second embodiment of the invention, in which elements identical or similar to those of the first embodiment are designated by the same reference numerals.

What is characteristic of this embodiment is that a groove 10 formed in a molded resin casing 2 is located above the resin sheet 3 as seen in plan view at a position closer to the runner 12 than a centerline of a top surface of the molded resin casing 2. Referring to FIGS. 4A-4G, 5A and 5B illustrating the manufacturing process of the semiconductor device 100 of the first embodiment, a mold 20 including an upper mold section 21 and a lower mold section 22 used in manufacturing the semiconductor device 100 of the second embodiment differs from that of the first embodiment in the following point.

As seen in plan view, the mold 20 for manufacturing the semiconductor device 100 of this embodiment is structured such that a ridge 23 of the upper mold section 21 for forming the groove 10 in the molded resin casing 2 is located to overlie the resin sheet 3, which is placed on the inside bottom surface of the lower mold section 22, at a position closer to the runner 12 than a centerline of the ceiling (upper inside surface) of the upper mold section 21.

According to the above-described mold structure of the second embodiment, the molding compound fed into the cavity 24 of the mold 20 in the transfer molding process effectively exerts a downward pressing force forcing the die pad 1a against the resin sheet 3, thus securing more reliable adhesion between the die pad 1a and the resin sheet 3.

Third Embodiment

Figure 8:
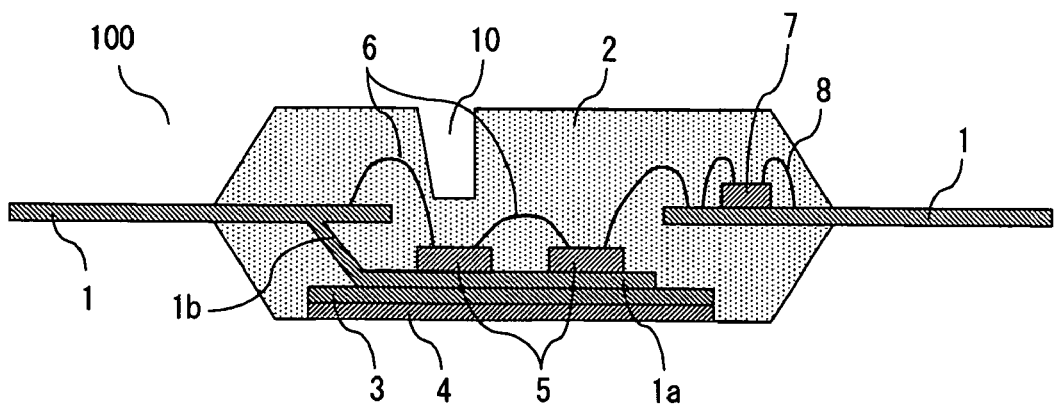
FIG. 8 is a cross-sectional side view of a semiconductor device according to a third embodiment of the invention.

FIG. 8 is a cross-sectional side view of a semiconductor device 100 according to a third embodiment of the invention, in which elements identical or similar to those of the foregoing embodiments are designated by the same reference numerals.

What is characteristic of this embodiment is that a groove 10 formed in a molded resin casing 2 has an upward widening inverted trapezoidal shape in side view, an upper end of the groove 10 having a larger width than a lower end thereof. For example, a side wall of the groove 10 nearer the runner 12 through which the resin was supplied in the molding operation is preferably inclined by 15 degrees to 45 degrees with respect to a plane perpendicular to an extending direction of the leads 1. Referring to FIGS. 4A-4G, 5A and 5B illustrating the manufacturing process of the semiconductor device 100 of the first embodiment, a mold 20 including an upper mold section 21 and a lower mold section 22 used in manufacturing the semiconductor device 100 of the third embodiment differs from that of the first embodiment in the following point.

The mold 20 for manufacturing the semiconductor device 100 of this embodiment is structured such that a ridge 23 of the upper mold section 21 for forming the groove 10 has a trapezoidal cross-sectional shape with a basal end (upper end) of the ridge 23 having a larger width than a far end (lower end) thereof.

According to the above-described mold structure of the third embodiment, the molding compound fed into the cavity 24 of the mold 20 in the transfer molding process effectively exerts a downward pressing force over a wider area forcing the die pad 1a against the resin sheet 3, thus securing more reliable adhesion between the die pad 1a and the resin sheet 3.

Fourth Embodiment

Figure 9:
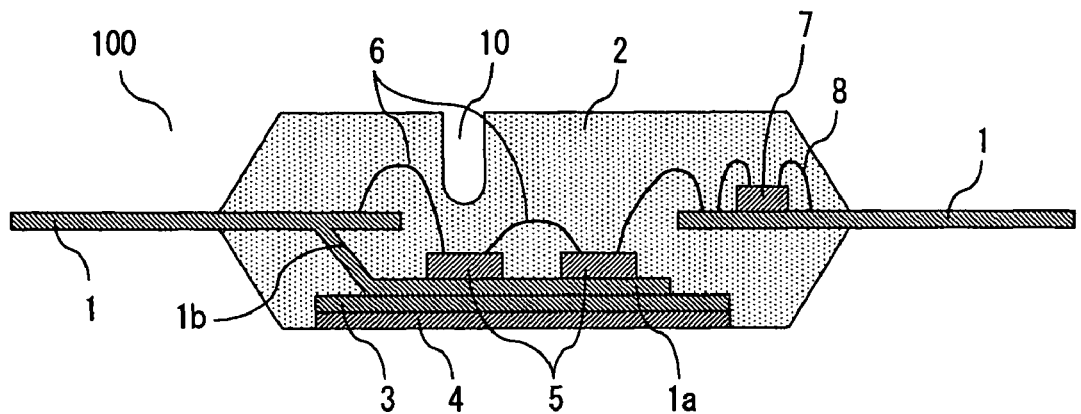
FIG. 9 is a cross-sectional side view of a semiconductor device according to a fourth embodiment of the invention.

FIG. 9 is a cross-sectional side view of a semiconductor device 100 according to a fourth embodiment of the invention, in which elements identical or similar to those of the foregoing embodiments are designated by the same reference numerals.

What is characteristic of this embodiment is that a groove 10 formed in a molded resin casing 2 has a U-shaped bottom in cross section. Referring to FIGS. 4A-4G, 5A and 5B illustrating the manufacturing process of the semiconductor device 100 of the first embodiment, a mold 20 including an upper mold section 21 and a lower mold section 22 used in manufacturing the semiconductor device 100 of the fourth embodiment differs from that of the first embodiment in that a ridge 23 of the upper mold section 21 for forming the groove 10 has a U-shaped far end (lower end) in cross section.

The above-described mold structure of the fourth embodiment is advantageous in that the U-shaped far end of the ridge 23 for forming the groove 10 reduces wear of the ridge 23 caused by the flow of the molding compound during the transfer molding process. This serves to prolong the useful life of mold components and reduce overall equipment cost for manufacturing the semiconductor device 100.

Fifth Embodiment

Figure 10:
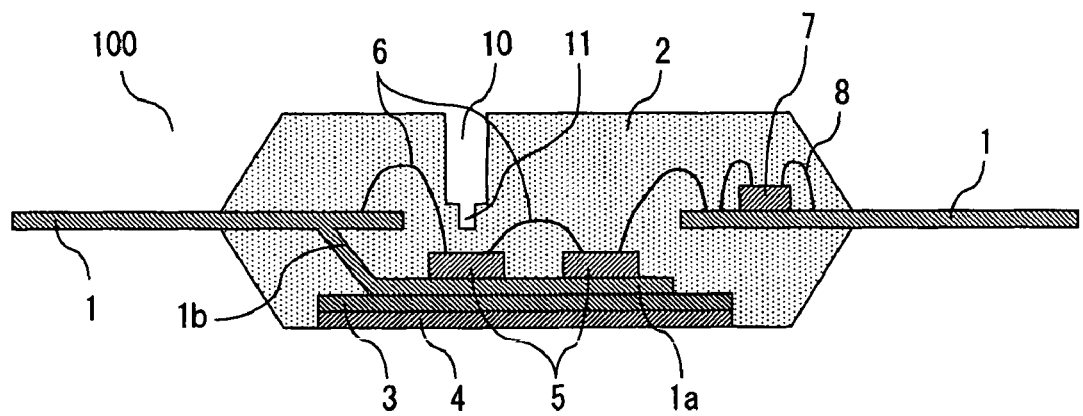
FIG. 10 is a cross-sectional side view of a semiconductor device according to a fifth embodiment of the invention.

FIG. 10 is a cross-sectional side view of a semiconductor device 100 according to a fifth embodiment of the invention, in which elements identical or similar to those of the foregoing embodiments are designated by the same reference numerals.

What is characteristic of this embodiment is that there is one or more indentations or pits 11 in a bottom of a groove 10 formed in a molded resin casing 2, each pit 11 having a diameter smaller than the width of the groove 10. Each pit 11 is a halfway buried remainder of a hole in which a squeeze pin used for forcing a die pad 1a against a resin sheet 3 was inserted during the transfer molding process. Referring to FIGS. 4A-4G, 5A and 5B illustrating the manufacturing process of the semiconductor device 100 of the first embodiment, a mold 20 including an upper mold section 21 and a lower mold section 22 used in manufacturing the semiconductor device 100 of the fifth embodiment differs from that of the first embodiment in that one or more squeeze pins extend downward from a ridge 23 of the upper mold section 21 for forming the groove 10 in the molded resin casing 2. Having a diameter smaller than the width of a far end (lower end) of the ridge 23, individual squeeze pins force the die pad 1a against the resin sheet 3 when the molding compound is fed into a cavity 24 of the mold 20.

This structure of the fifth embodiment is advantageous in that the squeeze pins used in the transfer molding process secure more reliable adhesion between the die pad 1a and the resin sheet 3.

What is claimed is:

1. A semiconductor device, comprising:
   a semiconductor chip;
   a die pad on which the semiconductor chip is mounted;
   a dielectric resin sheet placed on one side of the die pad opposite the semiconductor chip, a first surface of the resin sheet being firmly adhered to the die pad at a connecting portion; and
   a resin casing made by a molding operation in which the semiconductor chip, the die pad and the resin sheet are molded by a resin in such a manner that a second surface of the resin sheet opposite the die pad is exposed to the exterior of the resin casing, a groove having a longitudinal axis formed in one surface of the resin casing, the longitudinal axis of the groove intersecting with the first surface of the resin sheet at the connecting portion of the resin sheet and the die pad, the groove extending parallel to the resin sheet continuously along an entire length of the resin casing and perpendicular to a runner through which the resin was supplied in the molding operation.

2. The semiconductor device according to claim 1, wherein the groove has an upward widening inverted trapezoidal shape in side view, an upper end of the groove having a larger width than a lower end thereof.

3. The semiconductor device according to claim 1, wherein the groove has a U-shaped bottom in cross section.

4. The semiconductor device according to claim 1, wherein there is at least one pit in a bottom of the groove, and wherein the pit having a diameter smaller than the width of the groove is a remainder of a hole in which a squeeze pin was inserted in the molding operation.

5. A mold for resin-molding a semiconductor device, said mold comprising an upper mold section and a lower mold section together forming a cavity inside for performing a molding operation in which a dielectric resin sheet is placed on an inside bottom surface of the lower mold section, a die pad is placed on an upper surface of the resin sheet at a connecting portion, a semiconductor chip is mounted on the die pad, and a resin is supplied into the cavity through a runner formed in the mold from one side thereof to mold elements including the resin sheet, the die pad and the semiconductor chip, wherein the upper mold section has a ridge projecting into the cavity from an upper inside surface of the upper mold section, the ridge extending continuously along an entire length of the mold and in a direction perpendicular to the runner and having a longitudinal axis located to intersect with the upper surface of the resin sheet at the connecting portion of the resin sheet and the die pad.

6. The semiconductor device according to claim 1, wherein the groove is located above the resin sheet as seen in plan view at a position closer to a position where the runner through which the resin was supplied in the molding operation was located than a centerline of said one surface of the resin casing.

7. The mold for resin-molding a semiconductor device according to claim 5, wherein the ridge is located to overlie the resin sheet as seen in plan view at a position closer to the runner than a centerline of the upper inside surface of the upper mold section.

* * * * *